US008358940B2

(12) United States Patent
Kucharski

(10) Patent No.: US 8,358,940 B2
(45) Date of Patent: Jan. 22, 2013

(54) METHOD AND SYSTEM FOR OPTOELECTRONIC RECEIVERS FOR UNCODED DATA

(75) Inventor: Daniel Kucharski, San Marcos, CA (US)

(73) Assignee: Luxtera Inc., Carlsbad, CA (US)

( * ) Notice: Subject to any disclaimer, the term of this patent is extended or adjusted under 35 U.S.C. 154(b) by 378 days.

(21) Appl. No.: 12/830,917

(22) Filed: Jul. 6, 2010

(65) Prior Publication Data

US 2011/0008060 A1      Jan. 13, 2011

Related U.S. Application Data

(60) Provisional application No. 61/270,665, filed on Jul. 10, 2009.

(51) Int. Cl.
*H04B 10/06* (2006.01)
(52) U.S. Cl. ............... 398/209; 375/345; 455/127.3; 455/253.2
(58) Field of Classification Search .............. 398/177, 398/209; 455/127.3, 253.2; 330/103, 98–100; 375/318, 345
See application file for complete search history.

(56) References Cited

U.S. PATENT DOCUMENTS 5,430,766 A * 7/1995 Ota et al. ............... 375/318
6,018,407 A * 1/2000 Hatakeyama et al. ...... 398/209

* cited by examiner

*Primary Examiner* — Leslie Pascal
(74) *Attorney, Agent, or Firm* — McAndrews, Held & Malloy Ltd.

(57) ABSTRACT

A method and system for optoelectronic receivers for uncoded data are disclosed and may include amplifying received electrical signals in a signal amplifier comprising differential gain stages with signal detectors coupled to the outputs. First and second output voltages may be tracked and held utilizing the signal detectors. A difference between the tracked and held value may be amplified in a feedback path of the gain stage, which enables the dynamic configuration of a decision level. The received electrical signals may be generated from an optical signal by a PIN detector, an avalanche photodiode, or a phototransistor. The electrical signal may be received from a read channel. The feedback path may comprise digital circuitry, including an A/D converter, a state machine, and a D/A converter. The detectors may comprise envelope detectors utilized to detect maximum or minimum voltages. The signal amplifier may be integrated in a photonically-enabled CMOS chip.

24 Claims, 7 Drawing Sheets

METHOD AND SYSTEM FOR OPTOELECTRONIC RECEIVERS FOR UNCODED DATA

CROSS-REFERENCE TO RELATED APPLICATIONS/INCORPORATION BY REFERENCE

This application makes reference to and claims priority to U.S. Provisional Application Ser. No. 61/270,655 filed on Jul. 10, 2009, which is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to signal processing. More specifically, certain embodiments of the invention relate to a method and system for single laser bidirectional links.

BACKGROUND OF THE INVENTION

As data networks scale to meet ever-increasing bandwidth requirements, the shortcomings of copper data channels are becoming apparent. Signal attenuation and crosstalk due to radiated electromagnetic energy are the main impediments encountered by designers of such systems. They can be mitigated to some extent with equalization, coding, and shielding, but these techniques require considerable power, complexity, and cable bulk penalties while offering only modest improvements in reach and very limited scalability. Free of such channel limitations, optical communication has been recognized as the successor to copper links.

Optical communication systems have been widely adopted for applications ranging from internet backbone, local area networks, data centers, supercomputing, to high-definition video. Due to superior bandwidth and low loss, optical fibers are the medium of choice for transporting high-speed binary data. However, virtually all data processing is still performed in the electrical domain. This necessitates an electrical-to-optical conversion (EO) in transmitters and optical-to-electrical (OE) conversion in receivers. Robust EO conversion is simpler, since electrical signals in the transmitter can be relatively large and well-controlled to match characteristics of lasers or optical modulators. On the other hand, OE recovery is complicated by numerous optical loss mechanisms present in practical links as well as penalties incurred due to transmitter non-idealities such as finite extinction ratio (ER).

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for integrated control system for optoelectronic receivers for uncoded data, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for optoelectronic receivers for uncoded data. Exemplary aspects of the invention may comprise amplifying received electrical signals in a signal amplifier comprising one or more differential gain stages with two or more signal detectors coupled to outputs of one or more of the differential gain stages. A value of a first sampled output voltage of a differential gain stage may be tracked and a value of a second sampled output voltage of the gain stage may be held utilizing the two or more signal detectors. A difference between the tracked value of the first sampled output voltage and the held value of the second sampled output voltage may be amplified in a feedback path of the differential gain stage, wherein the feedback path enables the dynamic configuration of a decision level for the signal amplifier. The received electrical signals may be generated from a received optical signal, which may be received utilizing a PIN detector, an avalanche photodiode, or a phototransistor. The electrical signal may be received from a read channel. The feedback path may comprise digital circuitry, including an analog-to-digital converter, a state machine, and a digital-to-analog converter. The signal detectors may comprise envelope detectors, which may be utilized to detect maximum or minimum voltages of the amplified received electrical signals. The signal amplifier may be integrated in a photonically-enabled CMOS chip.

Figure 1A:
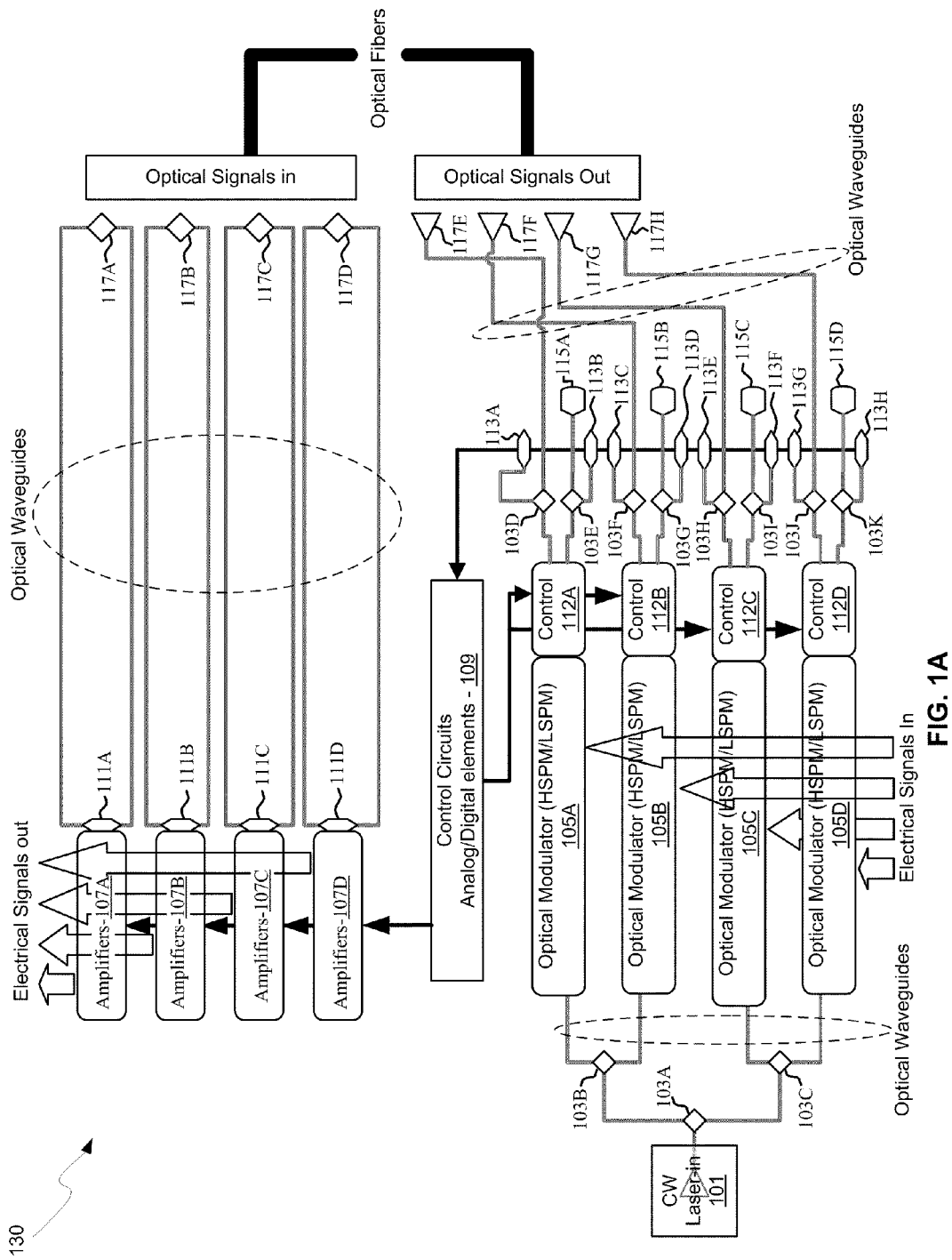
FIG. 1A is a block diagram of a photonically enabled CMOS chip, in accordance with an embodiment of the invention.

FIG. 1A is a block diagram of a photonically enabled CMOS chip, in accordance with an embodiment of the invention. Referring to FIG. 1A, there is shown optoelectronic devices on a CMOS chip 130 comprising optical modulators 105A-105D, high-speed photodiodes 111A-111D, monitor photodiodes 113A-113H, and optical devices comprising taps 103A-103K, optical terminations 115A-115D, and grating couplers 117A-117H. There is also shown electrical devices and circuits comprising amplifiers 107A-107D, analog and digital control circuits 109, and control sections 112A-112D. The amplifiers 107A-107D may comprise transimpedance and limiting amplifiers (TIA/LAs), for example. Optical signals are communicated between optical and optoelectronic devices via optical waveguides fabricated in the CMOS chip 130.

The optical modulators 105A-105D comprise Mach-Zehnder or ring modulators, for example, and enable the modulation of the CW laser input signal. The optical modulators 105A-105D comprise high-speed and low-speed phase modulation sections and are controlled by the control sections 112A-112D. The high-speed phase modulation section of the optical modulators 105A-105D may modulate a CW light source signal with a data signal. The low-speed phase modulation section of the optical modulators 105A-105D may compensate for slowly varying phase factors such as those induced by mismatch between the waveguides, waveguide temperature, or waveguide stress and is referred to as the passive phase, or the passive biasing of the MZI.

This mismatch between the waveguides may be intentional, such as in an imbalanced MZI, but is often unintentional in a nominally balanced MZI due to small imperfections in waveguide fabrication. The phase modulators then have a dual role: to compensate for the passive biasing of the MZI and to apply the additional phase modulation used to modulate the light intensity at the output port of the MZI according to a data stream. The former phase tuning and the latter phase modulation may be applied by separate, specialized devices, since the former is a low speed, slowly varying contribution, while the latter is typically a high speed signal. These devices are then respectively referred to as the LSPM and the HSPM. Examples for LSPM are thermal phase modulators (TPM), where a waveguide portion is locally heated up to modify the index of refraction of its constituting materials, or forward biased PIN junctions (PINPM) where current injection into the PIN junction modifies the carrier density, and thus the index of refraction of the semiconductor material. An example of an HSPM is a reversed biased PIN junction, where the index of refraction is also modulated via the carrier density, but which allows much faster operation, albeit at a lower phase modulation efficiency per waveguide length.

The outputs of the modulators are optically coupled via waveguides to the grating couplers 117E-117H. The taps 103D-103K comprise four-port optical couplers, for example, and are utilized to sample the optical signals generated by the optical modulators 105A-105D, with the sampled signals being measured by the monitor photodiodes 113A-113H. The unused branches of the taps 103D-103K are terminated by optical terminations 115A-115D to avoid back reflections of unwanted signals.

The grating couplers 117A-117H comprise optical gratings that enable coupling of light into and out of the CMOS chip 130. The grating couplers 117A-117D are utilized to couple light received from optical fibers into the CMOS chip 130, and the grating couplers 117E-117H are utilized to couple light from the CMOS chip 130 into optical fibers. The grating couplers 117A-117H may comprise single polarization grating couplers (SPGC) and/or polarization splitting grating couplers (PSGC). In instances where a PSGC is utilized, two input, or output, waveguides may be utilized.

The optical fibers may be epoxied, for example, to the CMOS chip, and may be aligned at an angle from normal to the surface of the CMOS chip 130 to optimize coupling efficiency. In an embodiment of the invention, the optical fibers may comprise single-mode fiber (SMF) and/or polarization-maintaining fiber (PMF). By integrating CMOS chips at each end of the optical fibers, a bidirectional link is enabled that may only require a single laser. In another embodiment of the invention, a single laser and a single fiber may be utilized to configure a bidirectional link. This may be enabled by using a PSGC, where two optical signals may be launched into the same fiber, for example.

The high-speed photodiodes 111A-111D convert optical signals received from the grating couplers 117A-117D into electrical signals that are communicated to the amplifiers 107A-107D for processing. The analog and digital control circuits 109 may control gain levels or other parameters in the operation of the amplifiers 107A-107D, which then communicate electrical signals off the CMOS chip 130.

The control sections 112A-112D comprise electronic circuitry that enable modulation of the CW laser signal received from the splitters 103A-103C. The optical modulators 105A-105D require high-speed electrical signals to modulate the refractive index in respective branches of a Mach-Zehnder interferometer (MZI), for example. In an embodiment of the invention, the control sections 112A-112D may include sink and/or source driver electronics that may enable a bidirectional link utilizing a single laser.

In operation, the CMOS chip 130 may be operable to receive and process uncoded data. In an embodiment of the invention, the decision threshold uncertainty associated with OE conversion as well as baseline wander associated with unspecified run lengths and unbalanced data may be mitigated by utilizing track and hold peak detectors to monitor voltage levels in electrical signals at amplifier outputs. The photodetectors 111A-111D may be coupled in a differential configuration with AC coupling via capacitors that connect cathode and anode terminals of the photodetectors to a first amplifier stage in the amplifiers 107A-107D, which may generate differential outputs. Dual-mode (track/hold) peak detectors combined with a decision feedback circuit may be utilized to monitor the peak, or valley, voltages and enable the dynamic configuration of the decision level of received data signals.

Accordingly, optical signals comprising uncoded data may be communicated to the CMOS chip 130 via optical fibers and the grating couplers 117A-117D. The optical signals may be converted to electrical signals by the photodetectors 111A-111D. The electrical signals may be communicated to the amplifiers 107A-107D, which may comprise a plurality of stages. The output voltages at both differential outputs of one or more stages of the amplifiers 107A-107D may be monitored. By holding the measured peak voltage level of one differential output while tracking the other differential output voltage, decision levels for the amplifiers 107A-107D may be dynamically configured. In this manner, uncoded data may be processed accurately without requiring active DC balancing. In another embodiment of the invention, output currents may be monitored as opposed to output voltages.

In an exemplary embodiment of the invention, data decision may be fed back from the output of the amplifiers 107A-107D to peak detectors, and may be utilized to determine which peak detector is holding and which is tracking. Thus, the amplifiers 107A-107D may comprise two feedback paths. The analog path may compare outputs of the peak detectors and feed the amplifier input. The decision feedback path may comprise binary output and control the mode of the peak detectors.

Figure 1B:
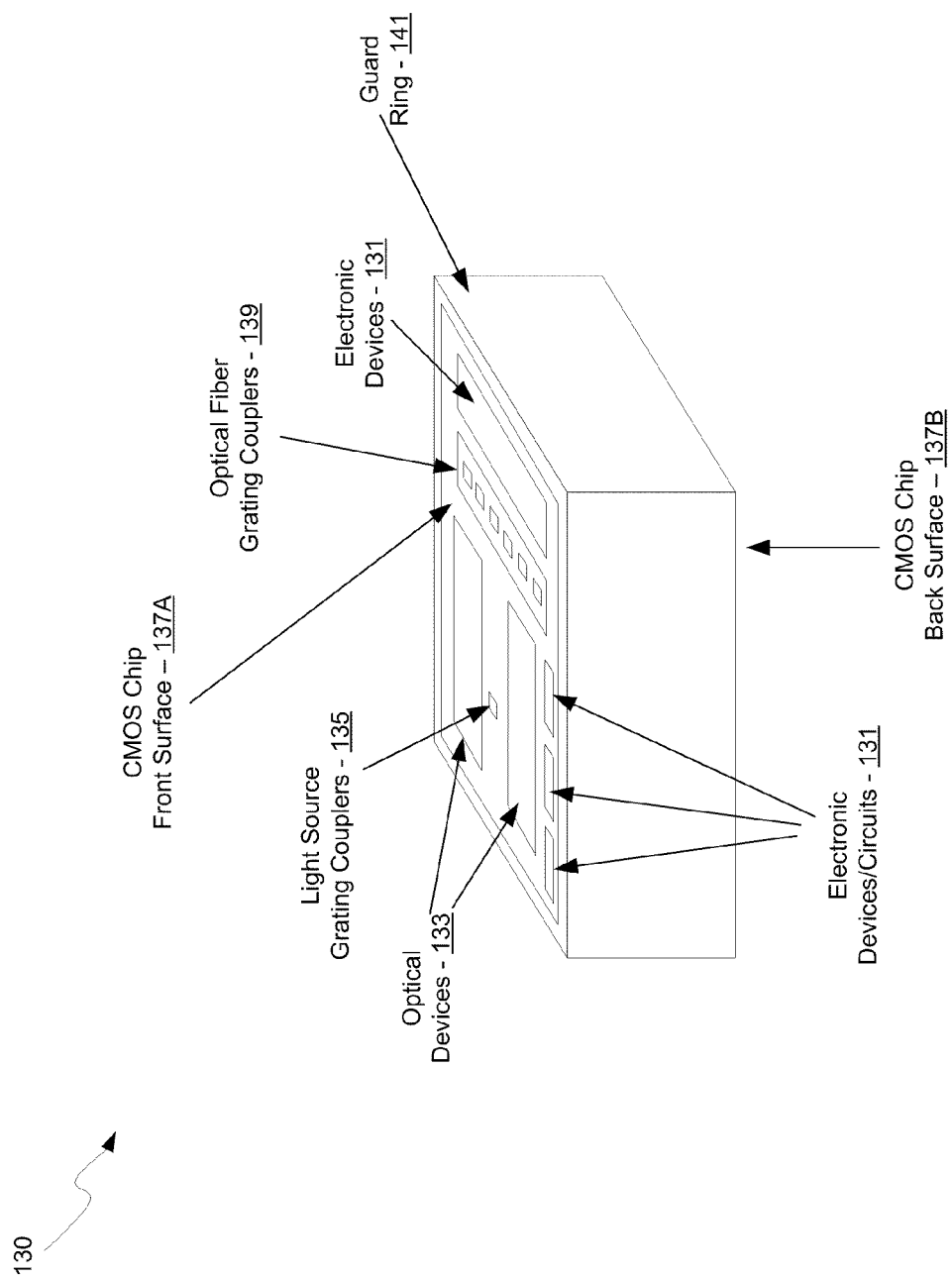
FIG. 1B is a diagram illustrating an exemplary CMOS chip, in accordance with an embodiment of the invention.

FIG. 1B is a diagram illustrating an exemplary CMOS chip, in accordance with an embodiment of the invention. Referring to FIG. 1B, there is shown the CMOS chip 130 comprising electronic devices/circuits 131, optical and optoelectronic devices 133, a light source interface 135, CMOS chip front surface 137A, CMOS chip back surface 137B, an optical fiber interface 139, and CMOS guard ring 141.

The light source interface 135 and the optical fiber interface 139 comprise grating couplers that enable coupling of light signals via the CMOS chip surface 137, as opposed to the edges of the chip as with conventional edge-emitting devices. Coupling light signals via the CMOS chip surface 137 enables the use of the CMOS guard ring 141 which protects the chip mechanically and prevents the entry of contaminants via the chip edge.

The electronic devices/circuits 131 comprise circuitry such as the amplifiers 107A-107D and the analog and digital control circuits 109 described with respect to FIG. 1A, for example. The optical and optoelectronic devices 133 comprise devices such as the taps 103A-103K, optical terminations 115A-115D, grating couplers 117A-117H, optical modulators 105A-105D, high-speed photodiodes 111A-111D, and monitor photodiodes 113A-113H.

In an embodiment of the invention, uncoded data may be received and processed by the CMOS chip 130 utilizing dual-mode track and hold peak detectors at the differential outputs of one or more stages in amplifiers, such as the amplifiers 107A-107D. In this manner, the decision level may be accurately and dynamically configured for receiving and processing high-speed uncoded data.

In an exemplary embodiment of the invention, data decision may be fed back from the output of the amplifiers 107A-107D to peak detectors, and may be utilized to determine which peak detector is holding and which is tracking. Thus, the amplifiers 107A-107D may comprise two feedback paths. The analog path may compare outputs of the peak detectors and feed the amplifier input. The decision feedback path may comprise binary output and control the mode of the peak detectors.

Figure 1C:
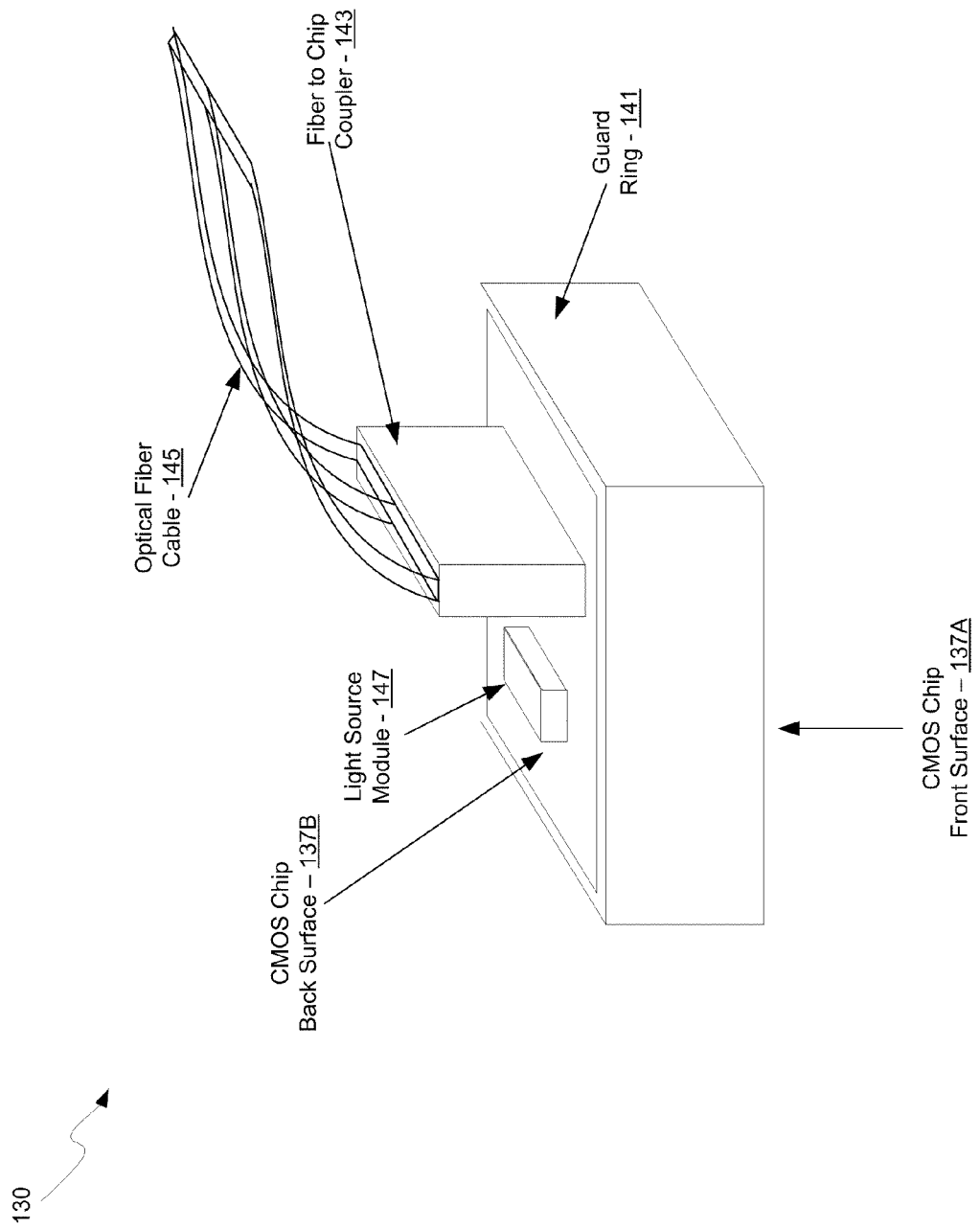
FIG. 1C is a diagram illustrating an exemplary CMOS chip coupled to an optical fiber cable, in accordance with an embodiment of the invention.

FIG. 1C is a diagram illustrating an exemplary CMOS chip coupled to an optical fiber cable, in accordance with an embodiment of the invention. Referring to FIG. 1C, there is shown the CMOS chip 130 comprising the CMOS chip front surface 137A, the CMOS chip back surface 137B, and the CMOS guard ring 141. There is also shown a fiber-to-chip coupler 143, an optical fiber cable 145, and an optical source assembly 147.

The CMOS chip 130 comprising the electronic devices/circuits 131, the optical and optoelectronic devices 133, the light source interface 135, the CMOS chip surface 137, and the CMOS guard ring 141 may be as described with respect to FIG. 1B.

In an embodiment of the invention, the optical fiber cable may be affixed, via epoxy for example, to the CMOS chip back surface 137B. The fiber chip coupler 143 enables the physical coupling of the optical fiber cable 145 to the CMOS chip 130, and may enable a bidirectional link using one laser source.

Figure 2:
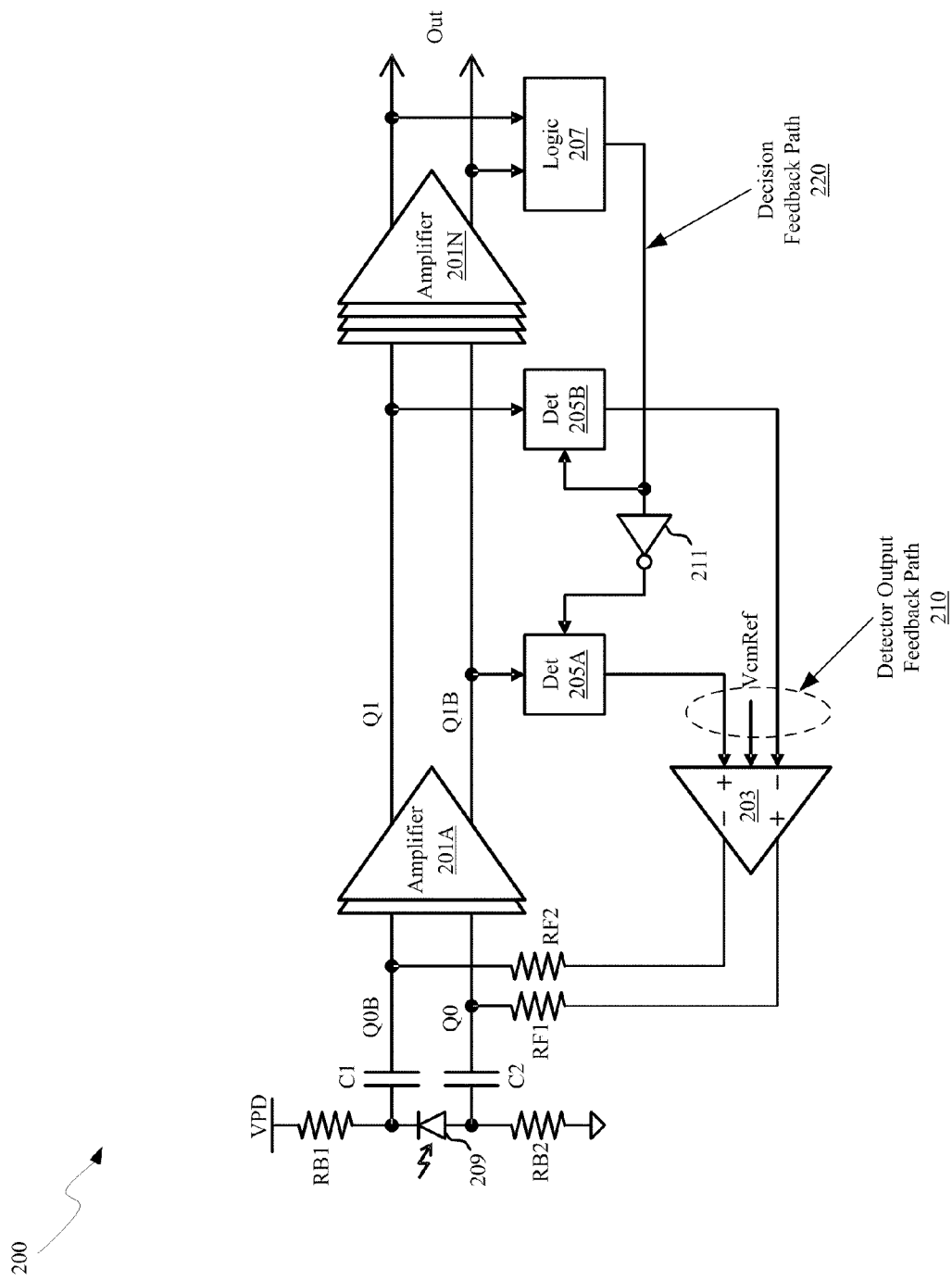
FIG. 2 is a block diagram of an uncoded data-enabled receiver, in accordance with an embodiment of the invention.

FIG. 2 is a block diagram of an uncoded data-enabled receiver, in accordance with an embodiment of the invention, which may be used in connection with the CMOS chip 130 of FIGS. 1A-1C, for example. Referring to FIG. 2, there is shown a receiver 200 comprising detector feedback path 210, decision feedback path 220, amplifiers 201A . . . 201N, a feedback amplifier 203, detectors 205A and 205B, a logic block 207, a photodetector 209, an inverter 211, bias resistors RB1 and RB2, feedback resistors RF1 and RF2, and coupling capacitors C1 and C2. There is also shown a photodetector bias voltage VPD, input signals Q0 and Q0B, output signals Q1, Q1B, and Out, and a common-mode reference voltage VcmRef.

The amplifiers 201A . . . 201N comprise a number, N, of gain stages and may comprise differential amplifiers for amplifying received electrical signals generated by the photodetector 209. The number of gain stages is not limited to the size shown in FIG. 2. Accordingly, any number of gain stages may be utilized, depending on chip space and power requirements, for example.

The feedback amplifier 203 may comprise a differential operational amplifier with common-mode feedback, for example, and may be operable to amplify a feedback signal comprising the output signals received from the detectors 205A and 205B. The feedback amplifier 203 may utilize a common-mode reference voltage which may determine the common mode voltage of its outputs while the differential output of the feedback amplifier is proportional to the difference of voltages applied to its inputs, which may be determined by the detectors 205A or 205B.

The signal detectors 205A and 205B may comprise envelope detectors, such as semiconductor diodes, that may be operable to measure peak, or valley, voltage values of the output signals Q1 and Q1B of the amplifier 201A. The signal detectors 205A and 205B comprise dual-mode capability, enabled to track a voltage or to hold a sampled voltage. In another embodiment of the invention, the detectors 205A and 205B may monitor output currents. In an embodiment of the invention, the signal detectors 205A and 205B may be coupled at any stage along the receiver 200 path. The coupling point may be based on signal amplitude versus a reference voltage, where a higher amplitude may relax detector matching requirements, allowing smaller transistors and thus less signal path loading.

The logic block 207 may comprise decision logic that may be operable to control the track/hold modes of the detectors 205A and 205B. The inverter 211 may ensure that the signal detectors 205A and 205B are always in opposite states, i.e. when the signal detector 205A is in track mode, the signal detector 205B is in hold mode.

The photodetector 209 may comprise a semiconductor photodetector, such as a germanium or silicon-germanium photodiode, integrated in the CMOS chip 130, and may be operable to convert a received optical signal into an electrical signal. The photodetector may comprise a photoconductor, a photodiode, or an avalanche photodetector, for example.

In operation, an optical signal may be detected by the photodetector 209 and converted to an electrical signal. The electrical signal may be AC-coupled to the differential amplifier 201A via the capacitors C1 and C2, resulting in input voltages Q0 and Q0B. The photodetector 209 may be biased by the voltage VPD and the bias resistors RB1 and RB2. The signals Q0 and Q0B may be amplified by the amplifier 201A, resulting in output voltages Q1 and Q1B, which may be monitored by the signal detectors 205 and 205B. One of the signal detectors 205A and 205B may hold a sampled voltage value while the other detector may track the output voltage. For example, when the signal detector 205A is tracking the peak, or valley, voltage of Q1B, the detector 205B may hold the peak, or valley, voltage of Q1. The state, sample or hold, of the signal detectors 205A and 205B may be configured by the logic block 207, with the inverted signal being applied to the signal detector 205A via the inverter 211. In another embodiment of the invention, the signal detectors 205A and 205B may measure current as opposed to voltage.

The output signals of the signal detectors 205A and 205B may be amplified by the feedback amplifier 203 and communicated back to the inputs of the amplifier 201A via the feedback resistors RF1 and RF2. In this manner, the difference between the tracked voltage and the hold voltage may be utilized as a feedback signal, thereby dynamically controlling the decision threshold of the receiver. In this manner, the receiver 200 may be operable to receive uncoded data without errors due to decision level shifts caused by long strings of unchanged bits, for example. Accordingly, no off-line calibration is required and effectively eliminates DC offset cancellation requirements since the decision level may be dynamically controlled.

In addition, due to the tracking capability of the receiver, initial decision feedback errors may be tolerated, providing a reliable startup without a training sequence regardless of the pattern received. In an exemplary embodiment, settling may be improved by applying a common-mode reference voltage to the first stage, amplifier 201A, at startup and then switch to feedback control after data is detected, such as indicated by a loss of signal (LOS) circuit, for example.

The RC constant of the receiver 200 may be affected by a pole of the feedback amplifier 203. This may be mitigated using a fast, one-stage operational amplifier with a pole well above the dominant pole of the feedback loop. Similarly, to ensure stability of the non-linear feedback circuit, the droop of the signal detectors 205A and 205B in track mode should be faster than the voltage droop associated with AC coupling. Stability may also be enhanced by utilizing high-speed CMOS technology, such as 130 nm or better, thereby reducing the delay of decision feedback of the logic block 207. For a smooth transition between track and hold modes of the detectors 205A and 205B, standard injection and leakage mitigation techniques may be utilized.

In an exemplary embodiment of the invention, a data decision may be fed back from the output of the amplifier 201N to the signal detectors 205A and 205B, and may be utilized to determine which signal detector is holding and which is tracking. Thus, the receiver 200 may comprise at least two feedback paths, the detector output feedback path 210 and the decision feedback path 220. The analog detector output feedback path 210 may compare outputs of the signal detectors 205A and 205B and feed the receiver 200 input. The decision feedback path 220 may comprise binary outputs and control the mode of the signal detectors 205A and 205B.

The invention is not limited to operation based on optical signals or optical communication, or necessarily limited to the embodiments shown in FIGS. 1A-1C. In a non-limiting example of another embodiment of the invention, the input signal to the receiver 200 may be from a magnetic or other disk drive, for example, where high throughput data transfer may be desired without data coding. Accordingly, aspects of the present invention may be incorporated into or operate in connection with a read channel, for example. In an exemplary embodiment, the output, Out, of the receiver 200 may comprise current-mode logic (CML) signals.

Figure 3:
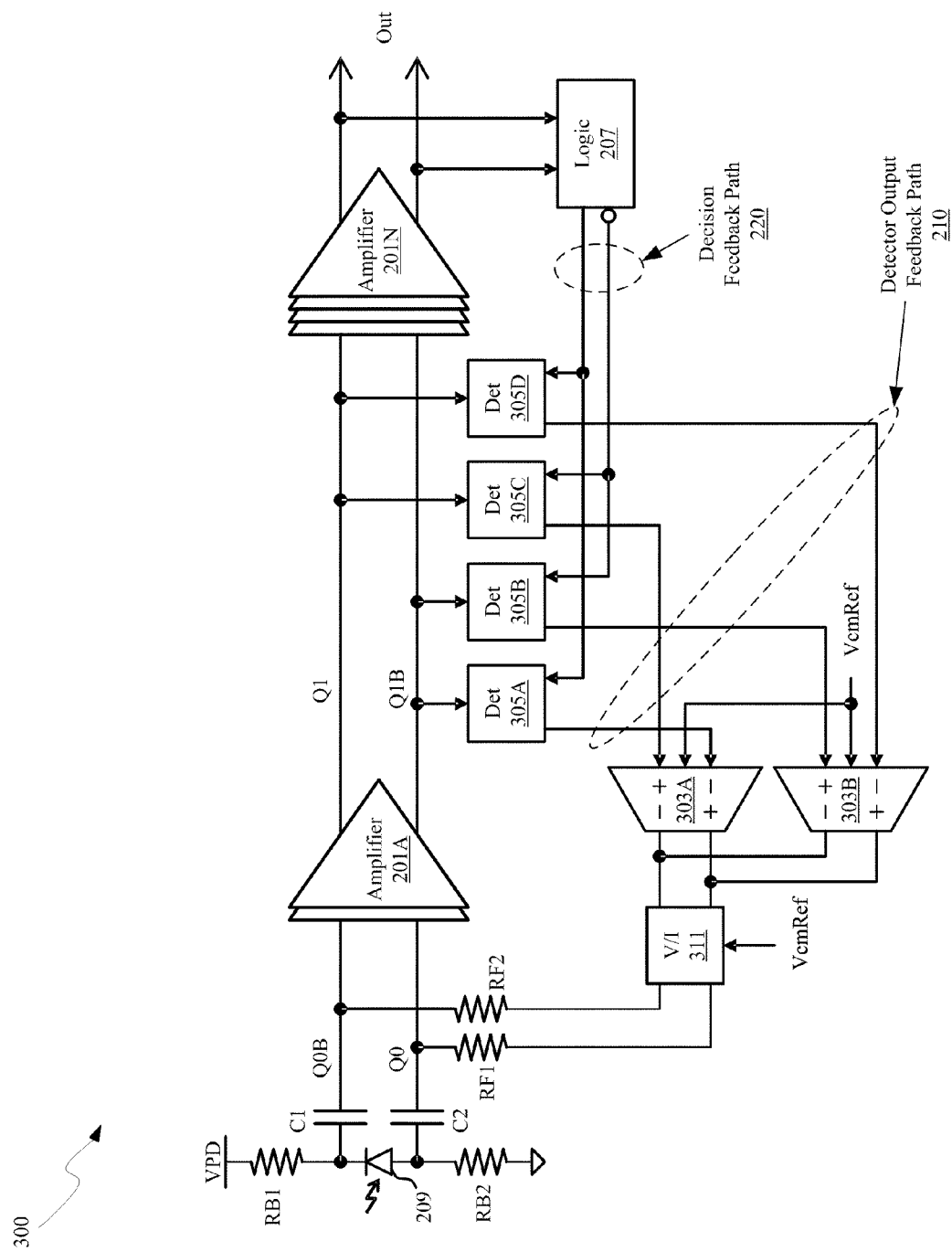
FIG. 3 is a block diagram of an uncoded data enabled receiver with dual signal detectors, in accordance with an embodiment of the invention.

FIG. 3 is a block diagram of an uncoded data enabled receiver with dual signal detectors, in accordance with an embodiment of the invention. Referring to FIG. 3, there is shown a receiver 200 comprising the amplifiers 201A . . . 201N, feedback amplifiers 303A and 303B, signal detectors 305A-305D, the logic block 207, the photodetector 209, a current to voltage converter 311, the bias resistors RB1 and RB2, the feedback resistors RF1 and RF2, and the coupling capacitors C1 and C2. There is also shown a photodetector bias voltage VPD, input signals Q0 and Q0B, output signals Q1, Q1B, and Out, and a common-mode reference voltage VcmRef.

The amplifiers 201A . . . 201N, the logic block 207, the photodetector 209, the bias resistors RB1 and RB2, the feedback resistors RF1 and RF2, and the coupling capacitors C1 and C2 may be as described in FIG. 2, and the detectors 305A-305D may be substantially similar to the detectors 205A and 205B.

The feedback amplifiers 303A and 303B may comprise transconductance amplifiers, for example, that may be operable to receive input voltage signals from the signal detectors 305A-305D and generate a proportional output current. The feedback amplifiers 303A and 303B may also receive as inputs the common-mode reference voltage VcmRef.

The current-to-voltage converter 311 may be operable to generate output voltages proportional to received input currents. The outputs of the current-to-voltage converter 311 may be coupled to the inputs of the amplifier 201A via the feedback resistors RF1 and RF2.

In operation, an optical signal may be detected by the photodetector 209 and converted to an electrical signal. The electrical signal may be AC-coupled to the differential amplifier 201A via the capacitors C1 and C2, resulting in input voltages Q0 and Q0B. The photodetector 209 may be biased by the voltage VPD and the bias resistors RB1 and RB2. The signals Q0 and Q0B may be amplified by the amplifier 201A, resulting in output voltages Q1 and Q1B, which may be monitored by the detectors 305A-305D. In an exemplary embodiment, one pair of detectors may monitor a bottom, or valley, voltage, while the other pair of detectors may monitor peak voltages. For example, the signal detectors 305A and 305C may monitor bottom voltages of Q1B and Q1, respectively, and the signal detectors 305B and 305D may monitor peak voltages of Q1B and Q1, respectively.

One of each pair may hold a sampled voltage value while the other signal detector may track the output voltage. For example, when the signal detector 305B is tracking the peak voltage of Q1B, the detector 305D may hold the peak voltage of Q1. The state of the signal detectors 205A and 205B, sample or hold, may be configured by the logic block 207, with the inverted signal being applied to the signal detectors 305B and 305C. In another embodiment of the invention, the signal detectors 305A-305D may measure current as opposed to voltage.

The output signals of the signal detectors 305A-305D may be amplified by the feedback amplifiers 303A and 303B, with peak voltage measurements being communicated to one amplifier, and the valley values to the other amplifier. The output currents of the amplifiers 303A and 303B may be converted to output voltages by the current-to-voltage converter 311 and communicated back to the inputs of the amplifier 201A via the feedback resistors RF1 and RF2. In this manner, the difference between the tracked peak and valley voltages and the hold peak and valley voltages may be utilized as feedback signals, thereby dynamically controlling the decision threshold of the receiver. In this manner, the receiver 300 may be operable to receive uncoded data without errors due to decision level shifts caused by long strings of unchanged bits, for example. In an exemplary embodiment, the output, Out, of the receiver 300 may comprise current-mode logic (CML) signals.

In an exemplary embodiment of the invention, a data decision may be fed back from the output of the amplifier 201N to the signal detectors 305A-305D, and may be utilized to determine which signal detector is holding and which is tracking. Thus, the receiver 300 may comprise at least two feedback paths, the detector output feedback path 210 and the decision feedback path 220. The analog detector output feedback path 210 may compare outputs of the signal detectors 305A-305D and feed the receiver 300 input. The decision feedback path 220 may comprise binary outputs and control the mode of the signal detectors 305A-305D.

Again, the invention is not limited to operation based on optical signals or optical communication, or limited necessarily to the embodiments shown in FIGS. 1A-1C. In a non-limiting example of another embodiment of the invention, the input signal to the receiver 300 may be from a magnetic or other disk drive, for example, where high throughput data transfer may be desired without data coding. Accordingly, aspects of the present invention may be incorporated into or operate in connection with a read channel, for example.

Figure 4:
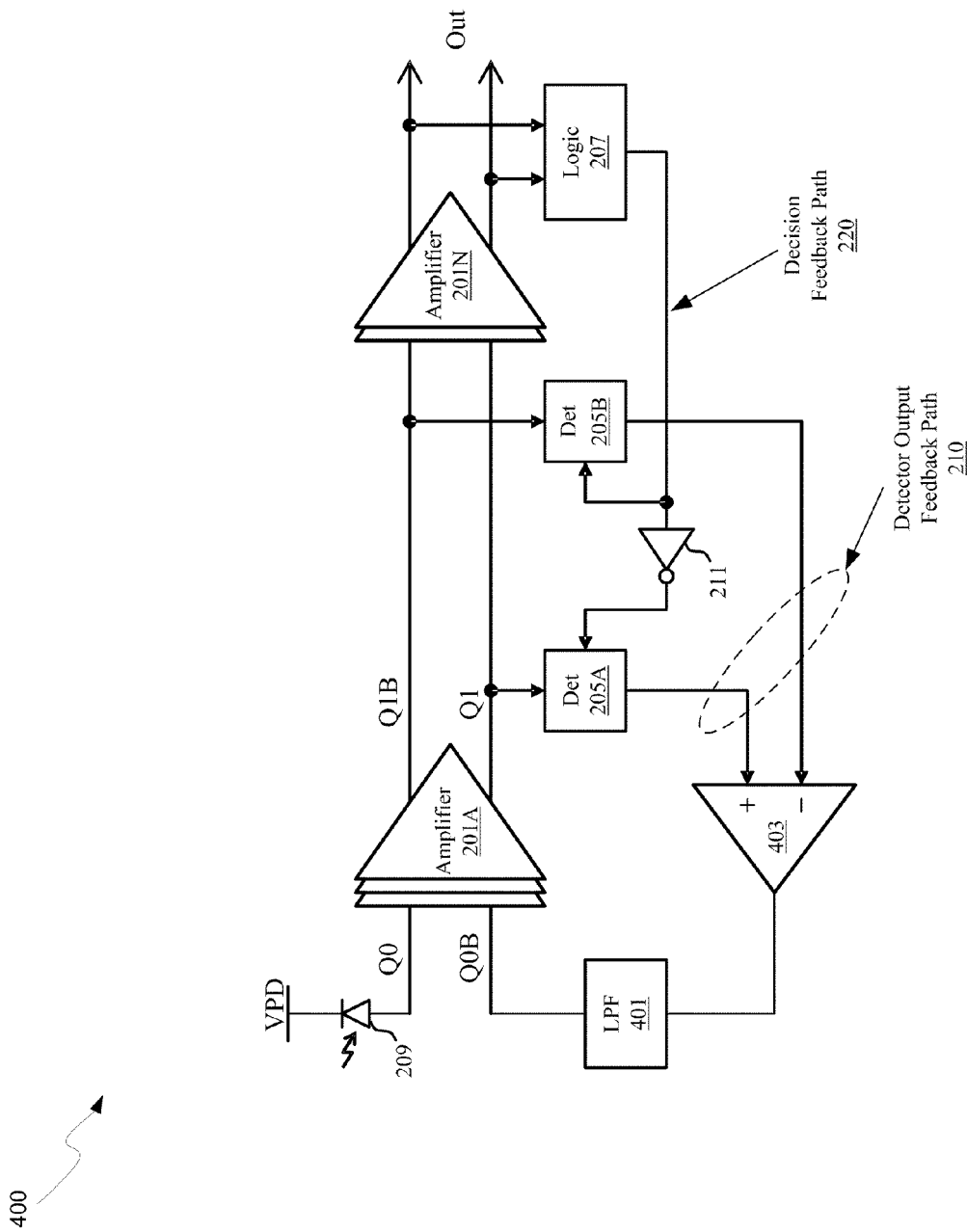
FIG. 4 is a block diagram of an uncoded data enabled receiver with a DC-coupled photodetector, in accordance with an embodiment of the invention.

FIG. 4 is a block diagram of an uncoded data enabled receiver with a DC-coupled photodetector, in accordance with an embodiment of the invention. Referring to FIG. 4, there is shown a receiver 400 comprising the amplifiers 201A . . . 201N, the signal detectors 205A and 205B, the logic block 207, the photodetector 209, the inverter 211, a low-pass filter 401, and a feedback amplifier 403.

The amplifiers 201A . . . 201N, the signal detectors 205A and 205B, the logic block 207, the photodetector 209, and the inverter 211 may be as described in FIG. 2. The low-pass filter 401 may comprise a filter in the feedback path of the receiver 400 to eliminate high-frequency effects in the feedback control.

The feedback amplifier 403 may comprise an operational amplifier, for example, that may be operable to amplify signals received from the detectors 405A and 405B.

In operation, the receiver 400 may operate substantially similar to the receivers 200 and 300, but with DC-coupled photodetector, which does not have the increased signal advantage of a differentially-coupled photodetector, but still provides the decision threshold tuning with the peak/valley voltage feedback loop control.

An optical signal may be detected by the photodetector 209 and converted to an electrical signal. The electrical signal may be DC-coupled to the differential amplifier 201A, resulting in input voltages Q0 and Q0B. The photodetector 209 may be biased by the voltage VPD. The signals Q0 and Q0B may be amplified by the amplifier 201A, resulting in output voltages Q1 and Q1B, which may be monitored by the signal detectors 205 and 205B. One of the signal detectors 205A and 205B may hold a sampled voltage value while the other detector may track the output voltage. For example, when the signal detector 205A is tracking the peak, or valley, voltage of Q1B, the signal detector 205B may hold the peak, or valley, voltage of Q1. The state, either sample or hold, of the signal detectors 205A and 205B may be configured by the logic block 207, with the inverted signal being applied to the signal detector 205A via the inverter 211.

The output signals of the signal detectors 205A and 205B may be amplified by the feedback amplifier 403 and communicated back to the inputs of the amplifier 201A via the low-pass filter 401. In this manner, the difference between the tracked voltage and the hold voltage may be utilized as a feedback signal, thereby dynamically controlling the decision threshold of the receiver. In this manner, the receiver 400 may be operable to receive uncoded data from a DC-coupled photodetector without errors due to decision level shifts caused by long strings of unchanged bits, for example. Accordingly, no off-line calibration is required and DC offset cancellation requirements are effectively eliminated since the decision level may be dynamically controlled.

In an exemplary embodiment of the invention, a data decision may be fed back from the output of the amplifier 201N to the signal detectors 205A and 205B, and may be utilized to determine which signal detector is holding and which is tracking. Thus, the receiver 400 may comprise at least two feedback paths, the detector output feedback path 210 and the decision feedback path 220. The analog detector output feedback path 210 may compare outputs of the signal detectors 205A and 205B and feed the receiver 400 input. The decision feedback path 220 may comprise binary outputs and control the mode of the signal detectors 205A and 205B.

Once again, the invention is not limited to operation based on optical signals or optical communication, or limited necessarily to the embodiments shown in FIGS. 1A-1C. In a non-limiting example of another embodiment of the invention, the input signal to the receiver 400 may be from a magnetic or other disk drive, for example, where high throughput data transfer may be desired without data coding. Accordingly, aspects of the present invention may be incorporated into or operate in connection with a read channel, for example.

Figure 5:
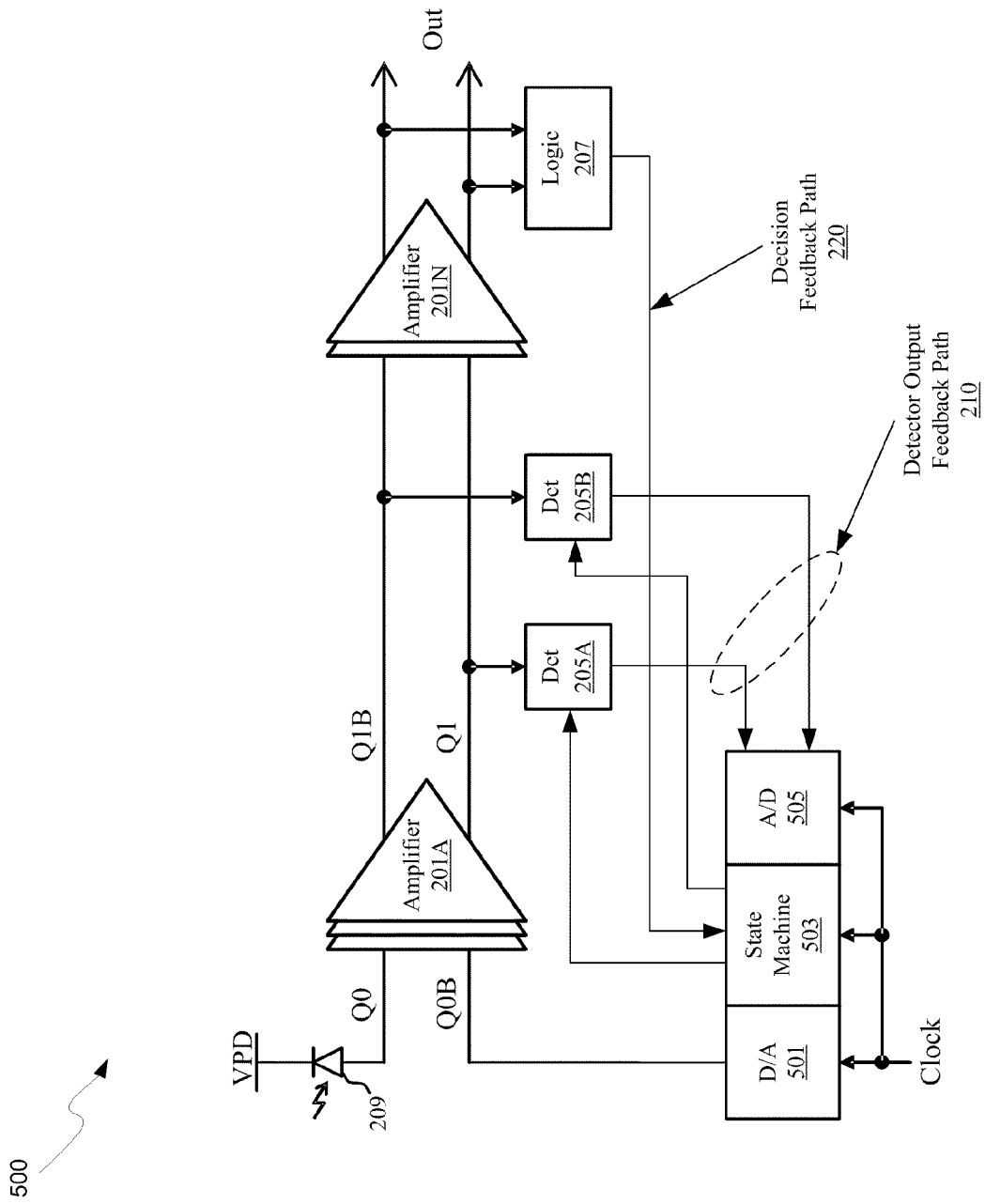
FIG. 5 is a block diagram of an uncoded data receiver with digital domain feedback, in accordance with an embodiment of the invention.

FIG. 5 is a block diagram of an uncoded data receiver with digital domain feedback, in accordance with an embodiment of the invention. Referring to FIG. 5, there is shown a receiver 500 comprising the amplifiers 201A . . . 201N, the detectors 205A and 205B, the logic block 207, the photodetector 209, a digital-to-analog (D/A) converter 501, a digital state machine 503, and an analog-to-digital (A/D) converter 505.

The amplifiers 201A . . . 201N, the signal detectors 205A and 205B, the logic block 207, and the photodetector 209 may be as described in FIG. 2. The state machine 503 may comprise configurable logic that may control the feedback path parameters. For example, the state machine 503 may be operable to filter out out-of-band noise and/or provide appropriate gain levels for received digital signals.

In operation, the receiver 500 may operate substantially similar to the receivers 200, 300, and/or 400, for example, but with a digital feedback loop. An optical signal may be detected by the photodetector 209 and converted to an electrical signal. The electrical signal may be DC-coupled to the differential amplifier 201A, resulting in input voltages Q0 and Q0B. The photodetector 209 may be biased by the voltage VPD. The signals Q0 and Q0B may be amplified by the amplifier 201A, resulting in output voltages Q1 and Q1B, which may be monitored by the signal detectors 205 and 205B. One of the signal detectors 205A and 205B may hold a sampled voltage value while the other detector may track the output voltage. For example, when the signal detector 205A is tracking the peak, or valley, voltage of Q1B, the signal detector 205B may hold the peak, or valley, voltage of Q1. The state, either sample or hold, of the signal detectors 205A and 205B may be configured by the logic block 207, via the state machine 503. In another embodiment of the invention, the signal detectors 205A and 205B may measure current as opposed to voltage.

The output signals of the signal detectors 205A and 205B may be converted to digital signals by the ND 505 and processed by the state machine 503, which may perform filtering, amplification, and other desired processing steps accomplished by the analog feedback paths in FIGS. 2-4, as well as other digital processing steps not enabled by analog circuitry. A clock signal, Clock, may provide synchronized processing in the D/A 501, the state machine 503, and the ND 505.

The processed signals may be converted back to analog signals by the D/A 501 before being communicated back to an input of the amplifier 201A, thereby completing the feedback path. In this manner, the difference between the tracked voltage and the hold voltage may be utilized as a feedback signal, thereby dynamically controlling the decision threshold of the receiver 500. Since the photodetector 209 is DC-coupled, there may be no baseline droop associated with AC-coupling, but because of the feedback stabilized decision threshold, the receiver 500 may be operable to receive uncoded data from a DC-coupled photodetector without errors. Accordingly, no off-line calibration is required and DC offset cancellation requirements may be effectively eliminated since the decision level may be dynamically controlled.

In an exemplary embodiment of the invention, a data decision may be fed back from the output of the amplifier 201N to the signal detectors 205A and 205B, and may be utilized to determine which signal detector is holding and which is tracking. Thus, the receiver 500 may comprise at least two feedback paths, the detector output feedback path 210 and the decision feedback path 220. The analog detector output feedback path 210 may convert the signals to digital in the ND 505 and compare outputs of the signal detectors 205A and 205B as well as feed the receiver 500 input. The decision feedback path 220 may comprise binary outputs and control the mode of the signal detectors 205A and 205B.

In another exemplary embodiment of the invention, the digital feedback path described with respect to FIG. 5 may be utilized with the differentially-coupled photodetector configurations described in FIGS. 2 and 3. Similarly, however, the invention is not limited to operation based on optical signals or optical communication, or necessarily limited to the photodetector configurations described in FIGS. 2 and 3 or to the embodiments illustrated in FIGS. 1A-1C. In another non-limiting example of an embodiment of the invention, the input signal Q0 to the receiver 500 may be from a magnetic or other disk drive, for example, where high throughput data transfer may be desired without data coding. Accordingly, aspects of the present invention may be incorporated into or operate in connection with a read channel, for example. In fact, aspects of the various embodiments may be used in any application desiring high throughput data transfer without data coding.

In an embodiment of the invention, a method and system are disclosed for optoelectronic receivers for uncoded data. Aspects of the invention may comprise amplifying received electrical signals Q0 and Q0B in a signal amplifier 107A-107D, 200, 300, 400, 500 comprising one or more differential gain stages 201A . . . 201N with two or more signal detectors 205A, 205B, 305A-305D coupled to outputs of one or more of the differential gain stages 201A . . . 201N. A value of a first sampled output voltage Q1, Q1B of a differential gain stage 201A . . . 201N may be tracked and a value of a second sampled output voltage of the gain stage 201A . . . 201N may be held utilizing the two or more signal detectors 205A, 205B, 305A-305D. A difference between the tracked value of the first sampled output voltage Q1, Q1B and the held value of the second sampled output voltage Q1, Q1B may be amplified in a feedback path of the differential gain stage 205A, 205B, 305A-305D, wherein the feedback path enables the dynamic configuration of a decision level for the signal amplifier 107A-107D, 200, 300, 400, 500. The mode of operation of the signal detectors 205A, 205B, 305A-305D may be determined by a decision feed back circuit comprising logic circuit 207 and/or a digital state machine 503 with ND and D/A converters 501 and 505.

The received electrical signals may be generated from a received optical signal, which may be received utilizing a PIN detector 117A-117D, 209, an avalanche photodiode 117A-117D, 209, or a phototransistor 117A-117D, 209. The electrical signal may be received from a read channel. The feedback path may comprise digital circuitry, including an analog-to-digital converter 505, a state machine 503, and a digital-to-analog converter 501. The detectors 205A, 205B, 305A-305D may comprise envelope detectors, which may be utilized to detect maximum or minimum voltages of the amplified received electrical signals Q1, Q1B. The signal amplifier 107A-107D, 200, 300, 400, 500 may be integrated in a photonically-enabled CMOS chip 130.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for processing signals, the method comprising:
   in a signal amplifier comprising one or more differential gain stages, two or more feedback paths, and two or more signal detectors coupled to outputs of one or more of said one or more differential gain stages:
       amplifying received electrical signals utilizing one of said one or more differential gain stages;
       tracking a value of a first sampled output signal and holding a value of a second sampled output signal of said one of said one or more differential gain stages utilizing said two or more signal detectors;
       amplifying a difference between said tracked value of said first sampled output signal and said held value of said second sampled output signal in a first feedback path of said signal amplifier, and
       controlling a mode of said signal detectors utilizing a second of said two or more feedback paths, wherein said two or more feedback paths enable the dynamic configuration of a decision level for said signal amplifier.

2. The method according to claim 1, comprising generating said received electrical signals from a received optical signal.

3. The method according to claim 2, comprising receiving said optical signal utilizing one or more of: a PIN photodiode, an avalanche photodiode, and a phototransistor.

4. The method according to claim 1, comprising receiving said electrical signal from a read channel.

5. The method according to claim 1, wherein said feedback path comprises digital circuitry.

6. The method according to claim 5, wherein said digital circuitry comprises an analog-to-digital converter, a state machine, and a digital-to-analog converter.

7. The method according to claim 1, wherein said two or more signal detectors comprise envelope detectors.

8. The method according to claim 7, comprising detecting maximum voltages of said amplified received electrical signals utilizing said envelope detectors.

9. The method according to claim 7, comprising detecting minimum voltages of said amplified received electrical signals utilizing said envelope detectors.

10. The method according to claim 1, wherein said signal amplifier is integrated in a photonically-enabled CMOS chip.

11. The method according to claim 1, wherein said signal detectors measure output voltages.

12. The method according to claim 1, wherein said signal detectors measure output currents.

13. A system for processing signals, the system comprising:
   one or more circuits in a signal amplifier comprising one or more differential gain stages, two or more feedback paths, and two or more signal detectors coupled to outputs of one or more of said one or more differential gain stages, said one or more circuits being operable to:
       amplify received electrical signals utilizing one of said one or more differential gain stages;
       track a value of a first sampled output signal and holding a value of a second sampled output signal of said one of said one or more differential gain stages utilizing said two or more signal detectors;
       amplify a difference between said tracked value of said first sampled output signal and said held value of said second sampled output signal in a first feedback path of said signal amplifier, and control a mode of said signal detectors utilizing a second of said two or more feedback paths, wherein said two or more feedback paths enable the dynamic configuration of a decision level for said signal amplifier.

14. The system according to claim 13, wherein said one or more circuits are operable to generate said received electrical signals from a received optical signal.

15. The system according to claim 14, wherein said one or more circuits are operable to receive said optical signal utilizing one or more of: a PIN photodiode, an avalanche photodiode, and a phototransistor.

16. The system according to claim 13, wherein said one or more circuits are operable to receive said electrical signal from a read channel.

17. The system according to claim 13, wherein said feedback path comprises digital circuitry.

18. The system according to claim 17, wherein said digital circuitry comprises an analog-to-digital converter, a state machine, and a digital-to-analog converter.

19. The system according to claim 13, wherein said two or more signal detectors comprise envelope detectors.

20. The system according to claim 19, wherein said one or more circuits are operable to detect maximum voltages of said amplified received electrical signals utilizing said envelope detectors.

21. The system according to claim 19, wherein said one or more circuits are operable to detect minimum voltages of said amplified received electrical signals utilizing said envelope detectors.

22. The system according to claim 13, wherein said signal amplifier is integrated in a photonically-enabled CMOS chip.

23. The system according to claim 13, wherein said signal detectors measure output voltages.

24. The system according to claim 13, wherein said signal detectors measure output voltages.

* * * * *